(12) United States Patent
Lu

(10) Patent No.: US 7,960,830 B2
(45) Date of Patent: Jun. 14, 2011

(54) ELECTRONIC ASSEMBLY HAVING A MULTILAYER ADHESIVE STRUCTURE

(75) Inventor: Su-Tsai Lu, Tongluo Township (TW)

(73) Assignee: Industrial Technology Research Institute (TW)

( * ) Notice: Subject to any disclaimer, the term of this patent is extended or adjusted under 35 U.S.C. 154(b) by 92 days.

(21) Appl. No.: 12/020,508

(22) Filed: Jan. 25, 2008

(65) Prior Publication Data

US 2008/0211092 A1 Sep. 4, 2008

Related U.S. Application Data

(60) Continuation-in-part of application No. 11/644,184, filed on Dec. 22, 2006, now Pat. No. 7,348,271, which is a division of application No. 10/714,277, filed on Nov. 14, 2003, now Pat. No. 7,154,176.

(51) Int. Cl.
*H01L 23/52* (2006.01)
*H01L 23/48* (2006.01)

(52) U.S. Cl. .......... 257/737; 257/734; 257/748

(58) Field of Classification Search ............ 257/737
See application file for complete search history.

(56) References Cited

U.S. PATENT DOCUMENTS

| | | | | |
|---|---|---|---|---|
| 5,393,697 | A * | 2/1995 | Chang et al. | 438/613 |
| 6,284,086 | B1 * | 9/2001 | Cardellino et al. | 156/273.7 |
| 6,333,555 | B1 | 12/2001 | Farnworth et al. | |
| 6,426,566 | B1 * | 7/2002 | Sawamoto | 257/783 |
| 6,518,097 | B1 | 2/2003 | Yim et al. | |
| 6,537,854 | B1 | 3/2003 | Chang et al. | |
| 6,767,818 | B1 | 7/2004 | Chang et al. | |
| 7,154,176 | B2 | 12/2006 | Huang et al. | |
| 2002/0048924 | A1 * | 4/2002 | Lay et al. | 438/613 |
| 2003/0183933 | A1 | 10/2003 | Kobayashi | |
| 2003/0214035 | A1 * | 11/2003 | Kwon et al. | 257/737 |
| 2004/0219715 | A1 | 11/2004 | Kwon et al. | |
| 2005/0098901 | A1 | 5/2005 | Chang et al. | |
| 2005/0184389 | A1 | 8/2005 | Chen et al. | |
| 2006/0091539 | A1 | 5/2006 | Tanaka | |
| 2007/0102815 | A1 | 5/2007 | Kaufmann et al. | |
| 2007/0111382 | A1 | 5/2007 | Huang et al. | |
| 2008/0284011 | A1 | 11/2008 | Chang et al. | |

OTHER PUBLICATIONS

Office Action from related U.S. Appl. No. 12/237,578, mailed Jul. 16, 2010.

* cited by examiner

*Primary Examiner* — N Drew Richards
*Assistant Examiner* — Mamadou Diallo
(74) *Attorney, Agent, or Firm* — Alston & Bird LLP

(57) ABSTRACT

An electronic assembly comprising a first substrate, a number of bonds on the first substrate, a second substrate spaced apart from the first substrate, a number of bumps on the second substrate, each of the bumps including an insulating body and a conductive portion, the conductive portion extending from a top surface of the insulating body via at least one sidewall of the insulating body toward the second substrate, and an adhesive between the first substrate and the second substrate, the adhesive including an insulating layer and a conductive layer, the insulating layer and the conductive layer being laminated with respect to each other, wherein the insulating layer is positioned closer to the first substrate than the conductive layer.

24 Claims, 10 Drawing Sheets

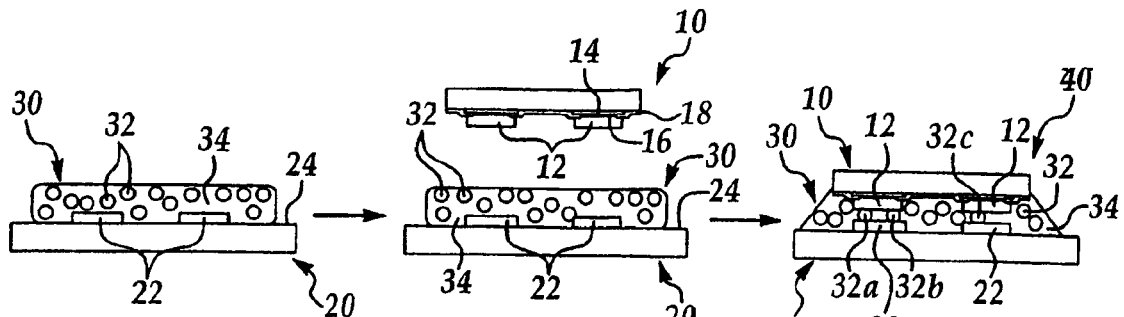
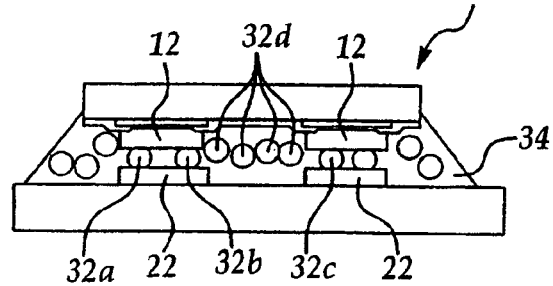
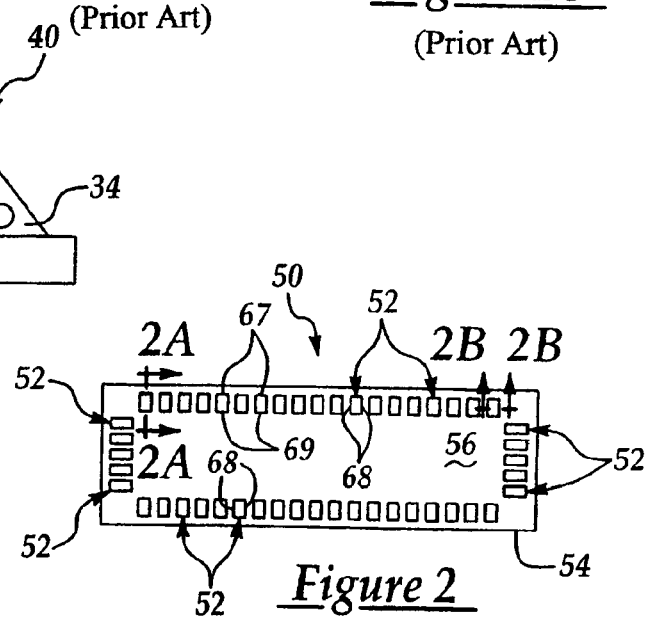
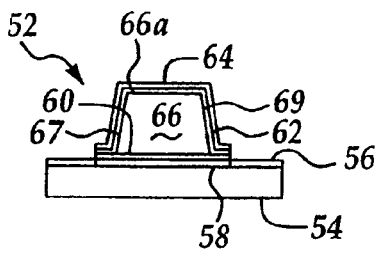
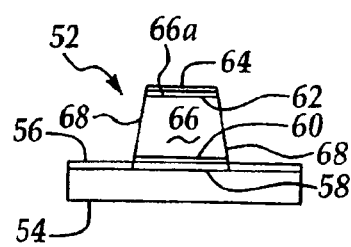
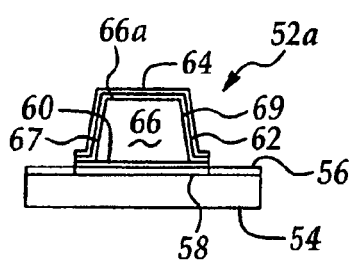
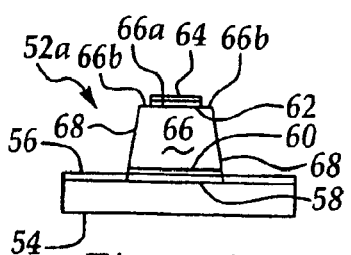

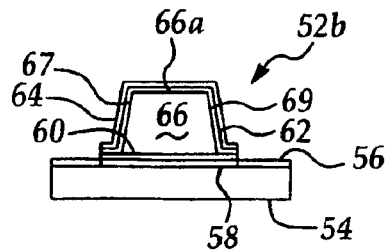
*Figure 4A*
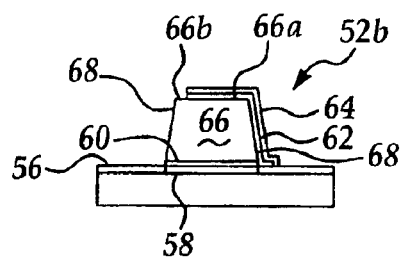
*Figure 4B*
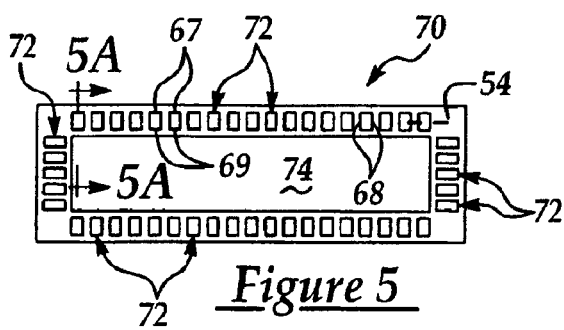
*Figure 5*  *Figure 5A*
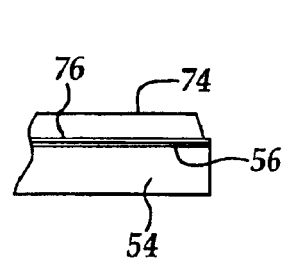
*Figure 5B*
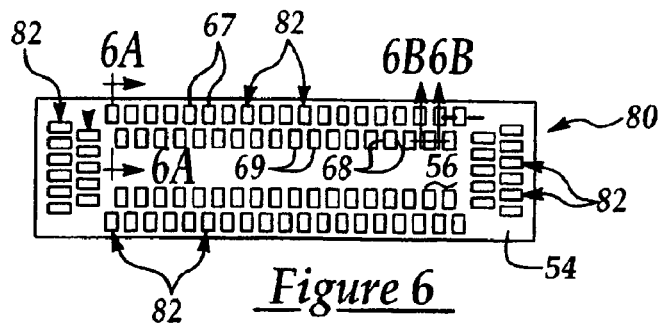
*Figure 6*
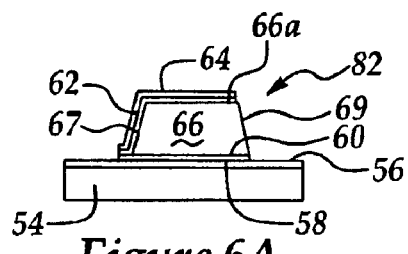
*Figure 6A*
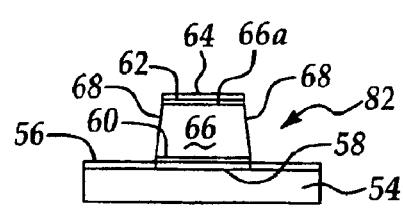
*Figure 6B*
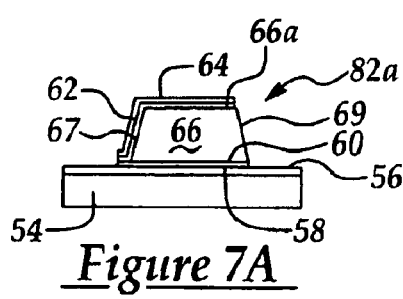
*Figure 7A*
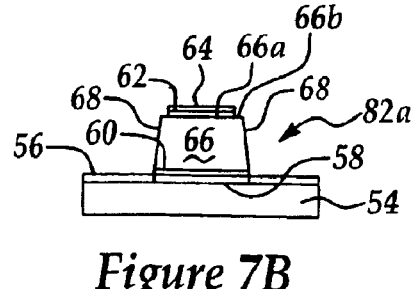
*Figure 7B*

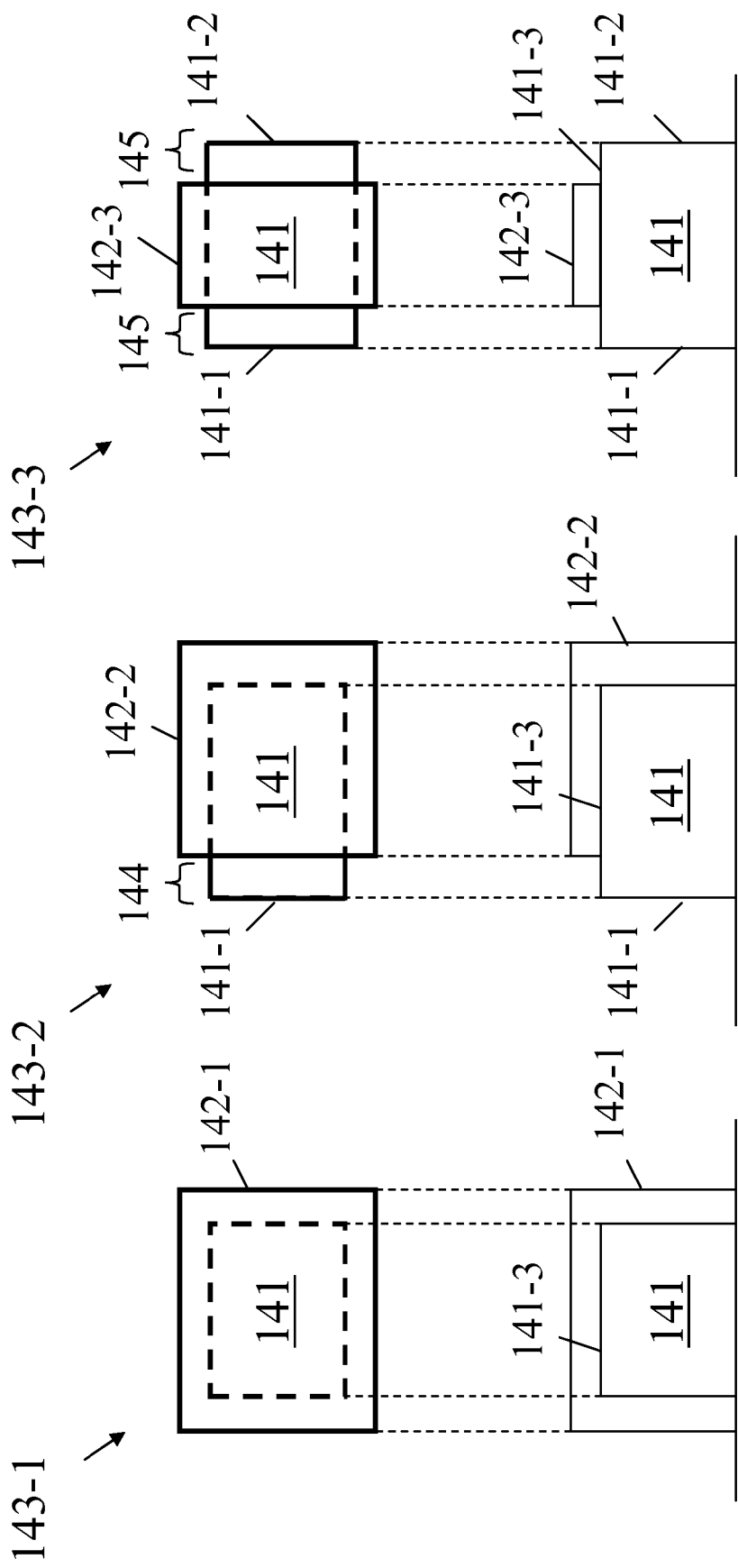

ELECTRONIC ASSEMBLY HAVING A MULTILAYER ADHESIVE STRUCTURE

CROSS-REFERENCE TO RELATED APPLICATIONS

This application is a continuation-in-part of U.S. patent application Ser. No. 11/644,184, filed Dec. 22, 2006, now allowed for issuance as a patent, which is a divisional of U.S. patent application Ser. No. 10/714,277, filed Nov. 14, 2003, now U.S. Pat. No. 7,154,176, which all are herein incorporated by reference.

BACKGROUND OF THE INVENTION

The present invention generally relates to an electronic assembly and, more particularly, to an electronic assembly having a multilayer adhesive structure.

In the recent development of integrated circuit (IC) chip mounting technologies, an IC chip may be bonded to an electronic substrate by establishing electrical communication between conductive bumps built on the IC chip and bond pads provided on the electronic substrate. When such bonding technique is used, an anisotropic conductive film (ACF) may be provided between the IC chip and the electronic substrate such that electrically conductive particles embedded in the ACF provide such electrical communication.

Referring initially to FIGS. 1A-1C, a process for bonding a microelectronic structure 10 to an electronic substrate 20 is shown. The microelectronic structure 10 may be provided with multiple, electrically-conductive bumps 12 formed on a surface for providing electrical communication to microelectronic circuits (not shown) in the microelectronic structure 10. Each of the conductive bumps 12 may be built on a bond pad 14 and a seed layer 16, and may be insulated by a dielectric layer 18. The electronic substrate 20 may be provided with multiple bond pads 22 formed on a top surface 24. The electronic substrate 20 may include but is not limited to one of a printed circuit board (PCB), silicon (Si) substrate and glass substrate. An anisotropic conductive film (ACF) 30, which may include multiple, electrically-conductive particles 32 embedded in an electrically-insulating material 34, may be applied over the top surface 24 of the electronic substrate 20.

The microelectronic structure 10, the electronic substrate 20 and the ACF 30 may be placed in a heat-bonding equipment, where a suitable pressure may be applied to press the microelectronic structure 10 against the electronic substrate 20, resulting in an electronic assembly 40 as shown in FIG. 1C. Referring to FIG. 1C, electrical communication between the microelectronic structure 10 and the electronic substrate 20 may be established by electrically-conductive particles 32a, 32b and 32c, which provide electrical conductance between the conductive bumps 12 and the bond pads 22.

The bonding process using ACF may be cost efficient. However, it may be difficult to control the distribution of the electrically-conductive particles 32 when an ACF is prepared. As a result, referring to FIG. 1D, a number of the electrically-conductive particles 32d may cluster between adjacent conductive bumps 12 and thus cause undesirable short-circuiting therebetween, which may damage the normal circuit function. To address the issue, ACF films with a controllable pattern of distribution of electrically-conductive particles have been proposed. However, such ACF films may be too expensive to be used in general bonding processes.

BRIEF SUMMARY OF THE INVENTION

Examples of the present invention may provide an electronic assembly comprising a first substrate, a number of bonds on the first substrate, a second substrate spaced apart from the first substrate, a number of bumps on the second substrate, each of the bumps including an insulating body and a conductive portion, the conductive portion extending from a top surface of the insulating body via at least one sidewall of the insulating body toward the second substrate, and an adhesive between the first substrate and the second substrate, the adhesive including an insulating layer and a conductive layer, the insulating layer and the conductive layer being laminated with respect to each other, wherein the insulating layer is positioned closer to the first substrate than the conductive layer.

Some examples of the present invention may also provide an electronic assembly comprising a first substrate, a number of bonds on the first substrate, a second substrate spaced apart from the first substrate, a number of bumps on the second substrate, each of the bumps including an insulating body and a conductive portion, the conductive portion extending from a top surface of the insulating body via at least one sidewall of the insulating body toward the second substrate, and an adhesive between the first substrate and the second substrate, the adhesive including a first insulating layer, a second insulating layer and a conductive layer between the first insulating layer and the second insulating layer, wherein one of the first insulating layer and the second insulating layer is positioned near the first substrate and the other one of the first insulating layer and the second insulating layer is positioned near the second substrate.

Examples of the present invention may also provide an electronic assembly comprising a first substrate, a number of bonds on the first substrate, a second substrate spaced apart from the first substrate, a number of bumps on the second substrate, each of the bumps including an insulating body and a conductive portion, the conductive portion extending from a top surface of the insulating body via at least one sidewall of the insulating body toward the second substrate, and a multilayer adhesive between the first substrate and the second substrate, the multilayer adhesive including at least one insulating layer and a conductive layer, wherein the conductive layer includes conductive particles positioned over the bonds on the first substrate.

BRIEF DESCRIPTION OF THE SEVERAL VIEWS OF THE DRAWINGS

The foregoing summary as well as the following detailed description of the preferred embodiments of the present invention will be better understood when read in conjunction with the appended drawings. For the purposes of illustrating the invention, there are shown in the drawings embodiments which are presently preferred. It is understood, however, that the invention is not limited to the precise arrangements and instrumentalities shown. In the drawings:

FIGS. 1A-1D are schematic cross-sectional views illustrating a conventional bonding process for mounting a microelectronic structure to an electronic substrate by using an anisotropic conductive film (ACF);

FIG. 2 is a schematic view of a microelectronic structure provided with multiple conductive bumps in accordance with an example of the present invention;

FIG. 2A is a cross-sectional view of an exemplary conductive bump taken along lines 2A-2A of the microelectronic structure illustrated in FIG. 2;

FIG. 2B is a cross-sectional view of an exemplary conductive bump taken along lines 2B-2B of the microelectronic structure illustrated in FIG. 2;

FIG. 3A is a cross-sectional view of another exemplary conductive bump taken along lines 2A-2A of the microelectronic structure illustrated in FIG. 2;

FIG. 3B is a cross-sectional view of another exemplary conductive bump taken along lines 2B-2B of the microelectronic structure illustrated in FIG. 2;

FIG. 4A is a cross-sectional view of still another exemplary conductive bump taken along lines 2A-2A of the microelectronic structure illustrated in FIG. 2;

FIG. 4B is a cross-sectional view of still another exemplary conductive bump taken along lines 2B-2B of the microelectronic structure illustrated in FIG. 2;

FIG. 5 is a schematic view of a microelectronic structure provided with multiple conductive bumps in accordance with another example of the present invention;

FIG. 5A is a cross-sectional view of an exemplary conductive bump taken along lines 5A-5A of the microelectronic structure illustrated in FIG. 5;

FIG. 5B is a cross-sectional view of another exemplary conductive bump taken along lines 5A-5A of the microelectronic structure illustrated in FIG. 5;

FIG. 6 is a schematic view of a microelectronic structure provided with multiple conductive bumps in accordance with still another example of the present invention;

FIG. 6A is a cross-sectional view of an exemplary conductive bump taken along lines 6A-6A of the microelectronic structure illustrated in FIG. 6;

FIG. 6B is a cross-sectional view of an exemplary conductive bump taken along lines 6B-6B of the microelectronic structure illustrated in FIG. 6;

FIG. 7A is a cross-sectional view of another exemplary conductive bump taken along lines 6A-6A of the microelectronic structure illustrated in FIG. 6;

FIG. 7B is a cross-sectional view of another exemplary conductive bump taken along lines 6B-6B of the microelectronic structure illustrated in FIG. 6;

FIGS. 14B, 14C and 14D are schematic diagrams each showing a cross-sectional view and a top view of a bump in accordance with examples of the present invention;

DETAILED DESCRIPTION OF THE INVENTION

Figure 8A:
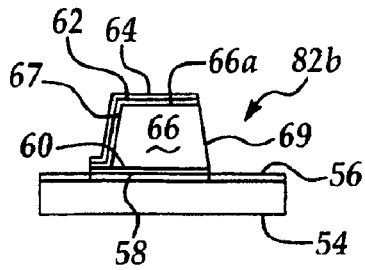
FIG. 8A is a cross-sectional view of still another exemplary conductive bump taken along lines 6A-6A of the microelectronic structure illustrated in FIG. 6.

Reference will now be made in detail to the present examples of the invention illustrated in the accompanying drawings. Wherever possible, the same reference numbers will be used throughout the drawings to refer to the same or like portions. It should be noted that the drawings are in greatly simplified form and are not to precise scale. In reference to the disclosure herein, for purposes of convenience and clarity only, directional terms such as inner, outer, upper, lower, inward and outward, are used with respect to the accompanying drawings. Such directional terms used in conjunction with the following description of the drawings should not be construed to limit the scope of the invention in any manner not explicitly set forth in the appended claims.

FIG. 2 is a schematic view of a microelectronic structure 50 provided with multiple conductive bumps 52 in accordance with an example of the present invention. FIG. 2A is a cross-sectional view of an exemplary conductive bump taken along lines 2A-2A of the microelectronic structure 50 illustrated in FIG. 2, and FIG. 2B is a cross-sectional view of an exemplary conductive bump taken along lines 2B-2B of the microelectronic structure illustrated in FIG. 2. Referring to FIG. 2, an integrated circuit (IC) chip or microelectronic device 50 may include a substrate 54 and multiple conductive bumps 52 provided on a surface of the substrate 54. The conductive bumps 52 may be arranged in a pattern along the sides of the substrate 54. Each of the conductive bumps 52 may be electrically coupled with an IC device (not shown) fabricated on the substrate 54.

Referring to FIGS. 2A and 2B, a passivation layer 56 may be formed over the substrate 54. A metal bond pad 58 may be provided in electrical contact with the IC device on the substrate 54. Each of the conductive bumps 52 may include an adhesive layer 62, an under-bump metal (UBM) 60 and a bump-forming layer 66. The UBM 60 may be formed on the bond pad 58 by, for example, a deposition process such as a chemical vapor deposition (CVD) process or physical vapor deposition (PVD) process. The bump-forming layer 66, which may include polyimide (PI) or other electrically insulating material, may be formed by, for example, depositing an insulating layer over the UBMs 60 and then patterning and etching the insulating layer to define the bump-forming layer 66 for the conductive bump 52s. As shown in FIGS. 2 and 2A, each of the conductive bumps 52 may include an outer wall 67 that faces outwardly from the chip 50 and an inner wall 69 that faces the center of the chip 50. As shown in FIGS. 2 and 2B, each of the conductive bumps 52 may further include sidewalls 68 that are positioned adjacent to the sidewalls 68 of the neighboring conductive bumps 52 on the chip 50.

An adhesion layer 62 may be deposited over the bump-forming layer 66, and then a metal conductive layer 64 may be deposited over the adhesion layer 62. The conductive layer 64 may include one or more of electrically conductive metal such as Au, Ag, Pt, Pd, Al, Cu, Sn and alloys thereof. The adhesion layer 62 may facilitate adhesion between the conductive layer 64 and the underlying bump-forming layer 66. In the example shown in FIG. 2A, the adhesion layer 62 and the conductive layer 64 of one conductive bump 52 may cover the outer wall 67, the inner wall 69 and an upper surface 66a of the bump-forming layer 66. As shown in FIG. 2B, both of the sidewalls 68 of the bump-forming layer 66 of the one conductive bump 52 may remain exposed and uncovered by the adhesion layer 62 and the conductive layer 64. The adhesion layer 62 and the conductive layer 64 may be etched from the sidewalls 68 of the one conductive bump 52. Accordingly, short-circuiting between the sidewalls 68 of adjacent conductive bumps 52 in an electronic assembly (such as the electronic assembly 88 illustrated in FIG. 10) may be prevented.

FIG. 3A is a cross-sectional view of another exemplary conductive bump taken along lines 2A-2A of the microelectronic structure 50 illustrated in FIG. 2, and FIG. 3B is a cross-sectional view of another exemplary conductive bump taken along lines 2B-2B of the microelectronic structure 50 illustrated in FIG. 2. Referring to FIG. 3A, the conductive layer 64 and the adhesion layer 62 may cover the upper surface 66a, outer wall 67 and inner wall 69 of a conductive bump 52a. Referring to FIG. 3B, the sidewalls 68 may be free from the conductive layer 64 and the adhesion layer 62 and thus may be exposed. Furthermore, the conductive layer 64 and adhesion layer 62 on the upper surface 66a may be etched to define at least one shoulder 66b, which is a region of the upper surface 66a uncovered by the conductive layer 64 and the adhesion layer 62.

FIG. 4A is a cross-sectional view of still another exemplary conductive bump taken along lines 2A-2A of the microelectronic structure 50 illustrated in FIG. 2, and FIG. 4B is a cross-sectional view of still another exemplary conductive bump taken along lines 2B-2B of the microelectronic structure 50 illustrated in FIG. 2. Referring to FIG. 4A, the conductive layer 64 and the adhesion layer 62 may cover the upper surface 66a, outer wall 67 and inner wall 69 of a conductive bump 52b. Referring to FIG. 4B, the conductive bump 52b may include an exposed sidewall 68 free from the conductive layer 64 and the adhesion layer 62, and a covered sidewall 68 on which the conductive layer 64 and the adhesion layer 62 are provided. A shoulder 66b may be provided at the upper surface 66a of the conductive bump 52b.

FIG. 5 is a schematic view of a microelectronic structure 70 provided with multiple conductive bumps 72 in accordance with another example of the present invention. FIG. 5A is a cross-sectional view of an exemplary conductive bump taken along lines 5A-5A of the microelectronic structure 70 illustrated in FIG. 5, and FIG. 5B is a cross-sectional view of another exemplary conductive bump taken along lines 5A-5A of the microelectronic structure 70 illustrated in FIG. 5. The microelectronic structure 70 may be similar to the microelectronic structure 50 described and illustrated with reference to FIG. 2 except that, for example, a protection layer 74 may be added. Referring to FIG. 5, multiple conductive bumps 72 may be provided on a surface of a substrate 54 and may be arranged in a pattern along the sides of the substrate 54. The protection layer 74, which may be provided at a center region of the substrate 54, may protect the passivation layer 56 from damage such as scratch.

Referring to FIG. 5A, an adhesion layer 62 and a conductive layer 64 may cover the outer wall 67 and the inner wall 69 of the conductive bump 72. Moreover, one or more of the sidewalls (not numbered), similar to the sidewalls 68 shown in FIG. 4B, of each of the conductive bumps 72 may be exposed. The adhesion layer 62 and the conductive layer 64 may extend over the substrate 54 toward the protection layer 74. The portion of the adhesion layer 62 and the conductive layer 64 extending on the substrate 54 may serve as a test probe pad 63 for electrical contact with a test probe 65 in testing the microelectronic structure 70.

Referring to FIG. 5B, a metal shielding layer 76 may be provided between the passivation layer 56 and the protection layer 74.

FIG. 6 is a schematic view of a microelectronic structure 80 provided with multiple conductive bumps 82 in accordance with still another example of the present invention. FIG. 6A is a cross-sectional view of an exemplary conductive bump taken along lines 6A-6A of the microelectronic structure 80 illustrated in FIG. 6, and FIG. 6B is a cross-sectional view of an exemplary conductive bump taken along lines 6B-6B of the microelectronic structure 80 illustrated in FIG. 6. Referring to FIG. 6, a number of conductive bumps 82 may be provided on the substrate 54 in rows in several sections. In the present example, a first row of conductive bumps 82 may be staggered with respect to a second row of conductive bumps 82 in the same section.

Referring to FIG. 6A, the outer wall 67 and the upper surface 66a of each of the conductive bumps 82 may be covered by the adhesion layer 62 and the conductive layer 64, while the inner wall 69 of each of the conductive bumps 82 may be exposed and uncovered by the adhesion layer 62 and conductive layer 64. Referring to FIG. 6B, the sidewalls 68 of each of the conductive bumps 82 may be exposed and uncovered by the adhesion layer 62 and conductive layer 64.

FIG. 7A is a cross-sectional view of another exemplary conductive bump taken along lines 6A-6A of the microelectronic structure 80 illustrated in FIG. 6, and FIG. 7B is a cross-sectional view of another exemplary conductive bump taken along lines 6B-6B of the microelectronic structure 80 illustrated in FIG. 6. Referring to FIG. 7A, the adhesion layer 62 and the conductive layer 64 may cover the upper surface 66a and the outer wall 67 of a conductive bumps 82a, while the inner wall 69 may be exposed. Referring to FIG. 7B, the conductive bumps 82a may include at least one shoulder 66b at the upper surface 66a.

Figure 8B:
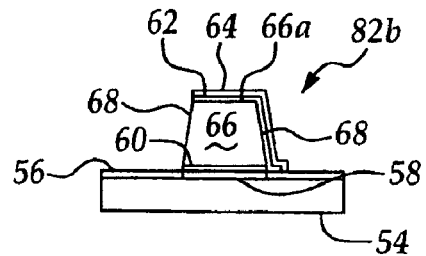
FIG. 8B is a cross-sectional view of still another exemplary conductive bump taken along lines 6B-6B of the microelectronic structure illustrated in FIG. 6.
Figure 9:
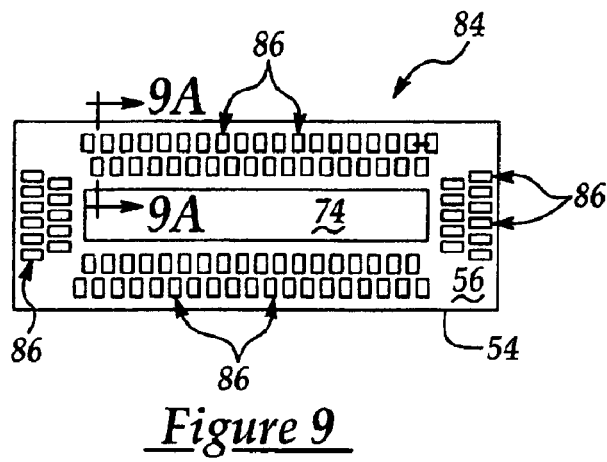
FIG. 9 is a schematic view of a microelectronic structure provided with multiple conductive bumps in accordance with yet another example of the present invention.
Figure 9A:
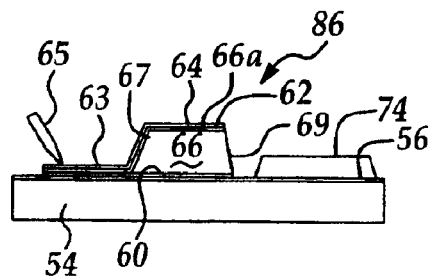
FIG. 9A is a cross-sectional view of an exemplary conductive bump taken along lines 9A-9A of the microelectronic structure illustrated in FIG. 9.
Figure 9B:
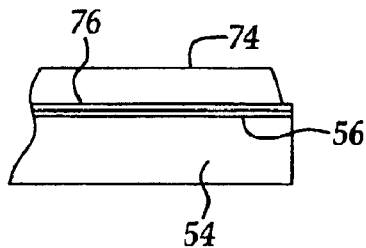
FIG. 9B is a cross-sectional view of another exemplary conductive bump taken along lines 9A-9A of the microelectronic structure illustrated in FIG. 9.

FIG. 8A is a cross-sectional view of still another exemplary conductive bump taken along lines 6A-6A of the microelectronic structure 80 illustrated in FIG. 6, and FIG. 8B is a cross-sectional view of still another exemplary conductive bump taken along lines 6B-6B of the microelectronic structure 80 illustrated in FIG. 6. Referring to FIG. 8A, the upper surface 66a and outer wall 67 of a conductive bump 82b may be covered by the adhesion layer 62 and the conductive layer 64, while the inner wall 69 may be exposed. Referring to FIG. 8B, one sidewall 68 may be covered by the adhesion layer 62 and the conductive layer 64, and the other sidewall 68 may be exposed FIG. 9 is a schematic view of a microelectronic structure 84 provided with multiple conductive bumps 86 in accordance with yet another example of the present invention. Furthermore, FIG. 9A is a cross-sectional view of an exemplary conductive bump taken along lines 9A-9A of the microelectronic structure 84 illustrated in FIG. 9, and FIG. 9B is a cross-sectional view of another exemplary conductive bump taken along lines 9A-9A of the microelectronic structure 84 illustrated in FIG. 9. The microelectronic structure 84 may be similar to the microelectronic structure 80 described and illustrated with reference to FIG. 6 except that, for example, a protection layer 74 may be added. Referring to FIG. 9, multiple conductive bumps 86 may be provided on the substrate 54 in rows and arranged near the sides of the substrate 54. The protection layer 74 may protect the passivation layer 56 from damage.

Referring to FIG. 9A, the adhesion layer 62 and the conductive layer 64 may cover the outer wall 67 and the upper surface 66a of each of the conductive bumps 86, while the inner wall 69 of each of the conductive bumps 86 and one or more of the sidewalls, similar to the sidewalls 68 illustrated in FIG. 8B, of each of the conductive bumps 86 may be exposed. The adhesion layer 62 and the conductive layer 64 may extend over the substrate 54. The portion of the adhesion layer 62 and the conductive layer 64 extending on the substrate 54 may serve as a test probe pad 63 for electrical contact with a test probe 65 in testing the microelectronic structure 84.

Referring to FIG. 9B, a metal shielding layer 76 may be provided between the passivation layer 56 and the protection layer 74.

Figure 10:
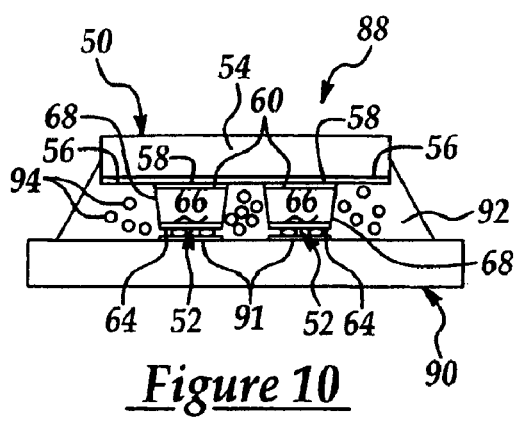
FIG. 10 is a cross-sectional view of an electronic assembly in accordance with an example of the present invention.

FIG. 10 is a cross-sectional view of an electronic assembly 88 in accordance with an example of the present invention. Referring to FIG. 10, the electronic assembly 88, which may take the form of but is not limited to a flip-chip assembly, may include a microelectronic structure similar to the microelectronic structure 50 described and illustrated with reference to FIG. 2, a substrate 90 on which multiple bond pads 91 are provided, and an anisotropic conductive film (ACF) 92 electrically coupling the microelectronic structure 50 and the substrate 90. Specifically, electrical connection between one of the conductive bumps 52 of the microelectronic structure 50 and one of the bond pads 91 of the substrate 90 may be established by one or more of conductive particles 94 in the ACF 92. The substrate 90 in one example may include one of a printed circuit board (PCB), Si substrate and glass substrate. Because the sidewalls 68 of each of the conductive bumps 52 may exhibit insulated for lack of a conductive layer, for example, the conductive layer 64 shown in FIG. 2B, the conductive particles 94 between adjacent conductive bumps 52, even clustered, may not cause short-circuiting of the adjacent conductive bumps 52.

The electronic assembly 88 in implementation may serve as a chip-on-glass (COG) structure, wherein a semiconductor chip may be fabricated on a glass substrate. In one example, each of the conductive bumps 52 may have a height of approximately 10 micrometers (μm), and each of the bond pads 91 may have a height of approximately 0.2 μm.

Figure 11:
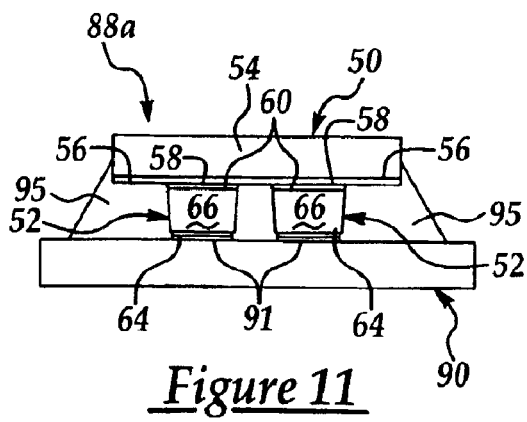
FIG. 11 is a cross-sectional view of an electronic assembly in accordance with another example of the present invention.

FIG. 11 is a cross-sectional view of an electronic assembly 88a in accordance with another example of the present invention. Referring to FIG. 11, the electronic assembly 88a may be similar to the electronic assembly 88 described and illustrated with reference to FIG. 10 except that, for example, a non-conductive film (NCF) 95 replaces the ACF 92. Electrical connection between one of the conductive bumps 52 of the microelectronic structure 50 and one of the bond pads 91 of the substrate 90 may be established by the conductive layer 64 of each of the conductive bumps 52.

Figure 12A:
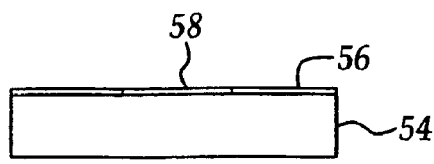
FIGS. 12A-12I are cross-sectional views illustrating a method of forming a conductive bump on an IC chip substrate in accordance with an example of the present invention.

FIGS. 12A-12I are cross-sectional views illustrating a method of forming a conductive bump 52a on an IC chip substrate 54 in accordance with an example of the present invention. Referring to FIG. 12A, a passivation layer 56 may be formed over the substrate 54. The passivation layer 56 may then be patterned and etched to facilitate a subsequent formation of a metal bond pad 58 in the patterned passivation layer. The bond pad 58 may serve as an electrical contact for an IC device (not shown) on the substrate 54.

Figure 12B:
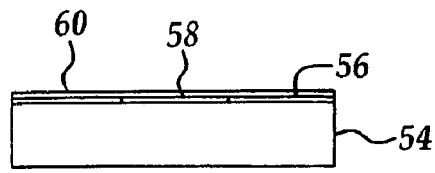

Referring to FIG. 12B, a layer of under-bump metal (UBM) 60 may be formed on the passivation layer 56 and the bond pad 58 by, for example, a CVD or PVD process. The UBM 60 may serve as an adhesion layer for the conductive bump 52a to be formed thereon.

Figure 12C:
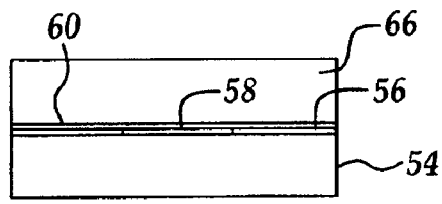

Referring to FIG. 12C, a bump-forming layer 66, which may include but is not limited to a non-conductive material such as polyimide (PI), may be formed over the UBM 60 by, for example, a spin-coating process or other suitable processes. The bump-forming layer 66 may serve as a supporting structure for the conductive bump 52a.

Figure 12D:
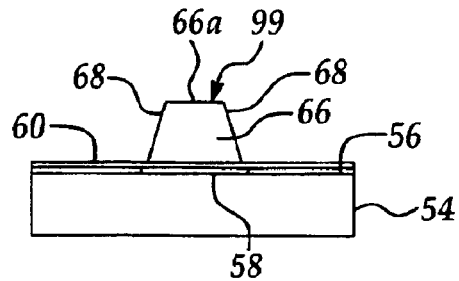

Referring to FIG. 12D, the bump-forming layer 66 may then be patterned and etched to form a bump structure 99 over the bond pad 58. The bump structure 99 thus formed may include an upper surface 66a and sidewalls 68.

Figure 12E:
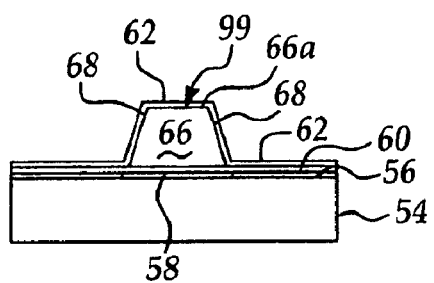
Figure 12F:
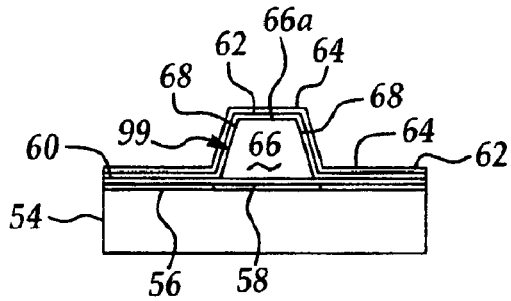

Referring to FIG. 12E, an adhesion layer 62 may be formed over the upper surface 66a and sidewalls 68 of the bump structure 99. Next, referring to FIG. 12F, a conductive layer 64 may be formed over the adhesion layer 62. The adhesion layer 62 and the conductive layer 64 in one example may be formed by a sputtering process or other suitable processes.

Figure 12G:
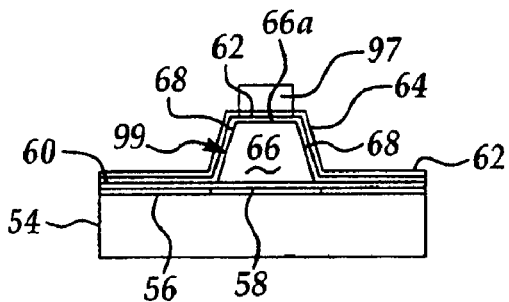

Referring to FIG. 12G, a patterned photoresist layer 97 may be formed on the conductive layer 64 over the upper surface 66a of the bump structure 99. The patterned photoresist layer 97 may expose portions of the conductive layer 64 and adhesion layer 62 corresponding to the sidewalls 68.

Figure 12H:
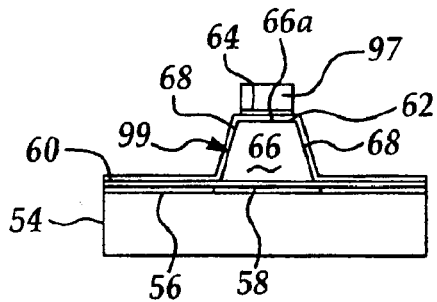
Figure 12I:
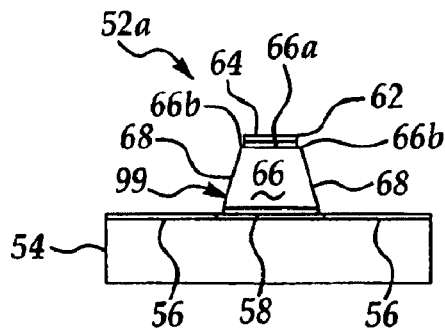

Referring to FIG. 12H, the portions of the conductive layer 64 and the adhesion layer 62 not covered by the photoresist 67 may be etched from the sidewalls 68 of the bump structure 99. The patterned photoresist layer 97 may then be stripped. Consequently, referring to FIG. 12I, the conductive bump 52a may be formed, which includes the adhesion layer 62 and conductive layer 64 on the upper surface 66a, and the exposed, insulating sidewalls 68 uncovered by the adhesion layer 62 and conductive layer 64.

Referring back to FIG. 12G, in the present example, the patterned photoresist layer 97 may be narrower in width than the upper surface 66a of the conductive bump 52a. As a result, at least one shoulder 66b may be defined. In another example, however, the patterned photoresist layer 97 may cover the entire area of the upper surface 66a, resulting in a structure free of such shoulder 66b.

Figure 13A:
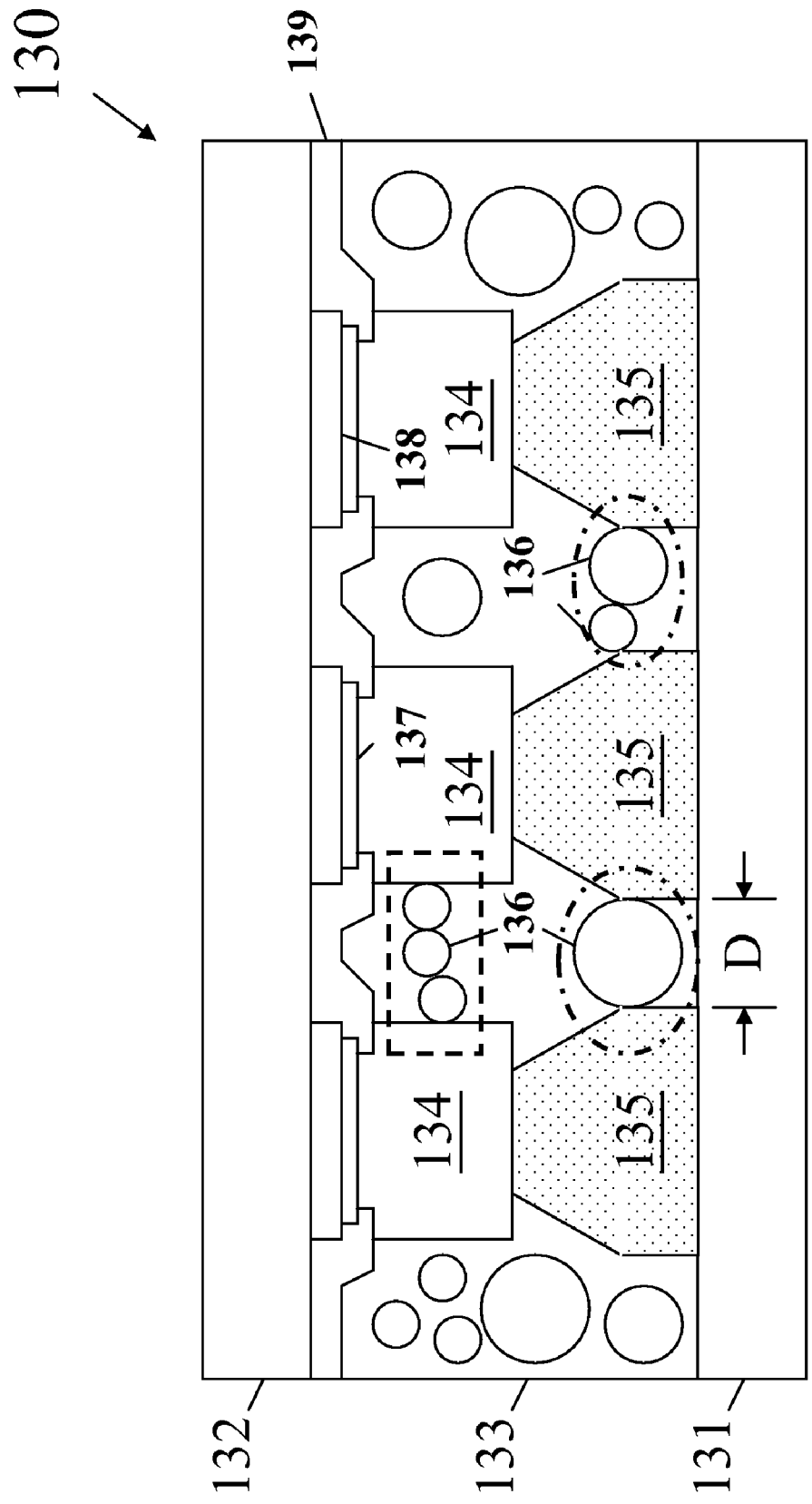
FIG. 13A is a schematic diagram illustrating short-circuiting issues with an electronic assembly.

FIG. 13A is a schematic diagram illustrating short-circuiting issues with an electronic assembly 130. Referring to FIG. 13A, the electronic assembly 130 may include a first substrate 131 on which metal bonds 135 may be provided, a second substrate 132 on which metal bumps 134 may be provided, and an ACF film 133 between the first substrate 131 and the second substrate 132 to facilitate electrical coupling of the metal bonds 135 and the metal bumps 134. The first substrate 131 may include a flexible substrate such as a polyimide (PI) substrate, while the second substrate 132 may include one of a glass substrate, PCB and Si substrate. Each of the metal bumps 134 such as gold bumps may be formed on a seed layer 137, which in turn may be formed on a pad 138. Furthermore, the metal bumps 134 may be electrically isolated from one another by an insulating layer 139.

The electronic assembly 130 in implementation may serve as a chip-on-film (COF) structure, wherein a semiconductor chip may be fabricated on a flexible substrate. A COF structure may be suitable for the mounting of semiconductor chips in apparatuses which are required to be light, thin and small, such as the mounting of a liquid crystal driver chip. Unlike the electronic assembly 88, which may serve as a COG structure as previously discussed with reference to FIG. 10, the electronic assembly 130 may have taller bonds. For example, each of the metal bonds 135 on the flexible substrate 131 may have a height of approximately 2 to 15 μm, which may be equal to that of the bumps 134. Furthermore, with the increasing interest in compact, light-weight and low-profile electronic products, the devices and components thereof are also manufactured with minimum feature size so as to meet the requirements for resolution. For example, the bond pitch "D" between adjacent metal bonds 135 may be approximately 5 μm or less.

With the metal bumps 134 formed on the second substrate 132, a first short-circuiting issue, which has been discussed previously with reference to FIG. 1D, may occur between adjacent metal bumps 134, as indicated by a dotted rectangular box. Furthermore, with the taller bonds 135 and finer bond pitch "D", a second short-circuiting issue due to conductive particles 136 in the ACF film 133 may occur between adjacent metal bonds 135, as indicated by dotted circles.

Figure 13B:
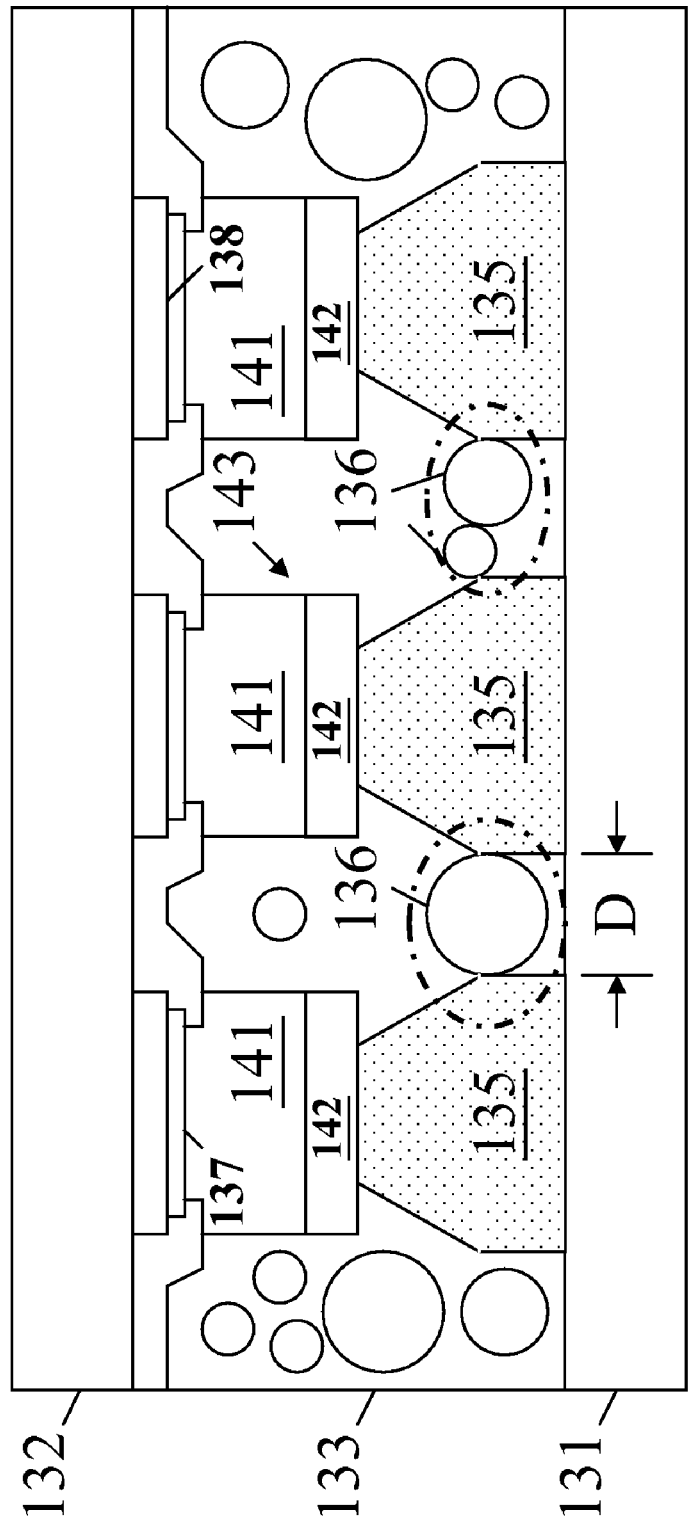
FIG. 13B is a schematic diagram illustrating short-circuiting issues with another electronic assembly.

FIG. 13B is a schematic diagram illustrating short-circuiting issues with another electronic assembly 140. Referring to FIG. 13B, the electronic assembly 140 may be similar to the electronic assembly 130 described and illustrated with reference to FIG. 13A except that, for example, bumps 143 may replace the bumps 134. Each of the bumps 143, which may be similar to the conductive bumps 52, 72, 82 and 86 respectively shown in FIGS. 2, 5, 6 and 9, may include an insulating or polymeric body 141 and a conductive portion 142. With the insulating body 141, the first short-circuiting issue may be prevented. However, the second short-circuiting issue due to the taller bonds 135 and finer pitch "D" can still occur.

Figure 14A:
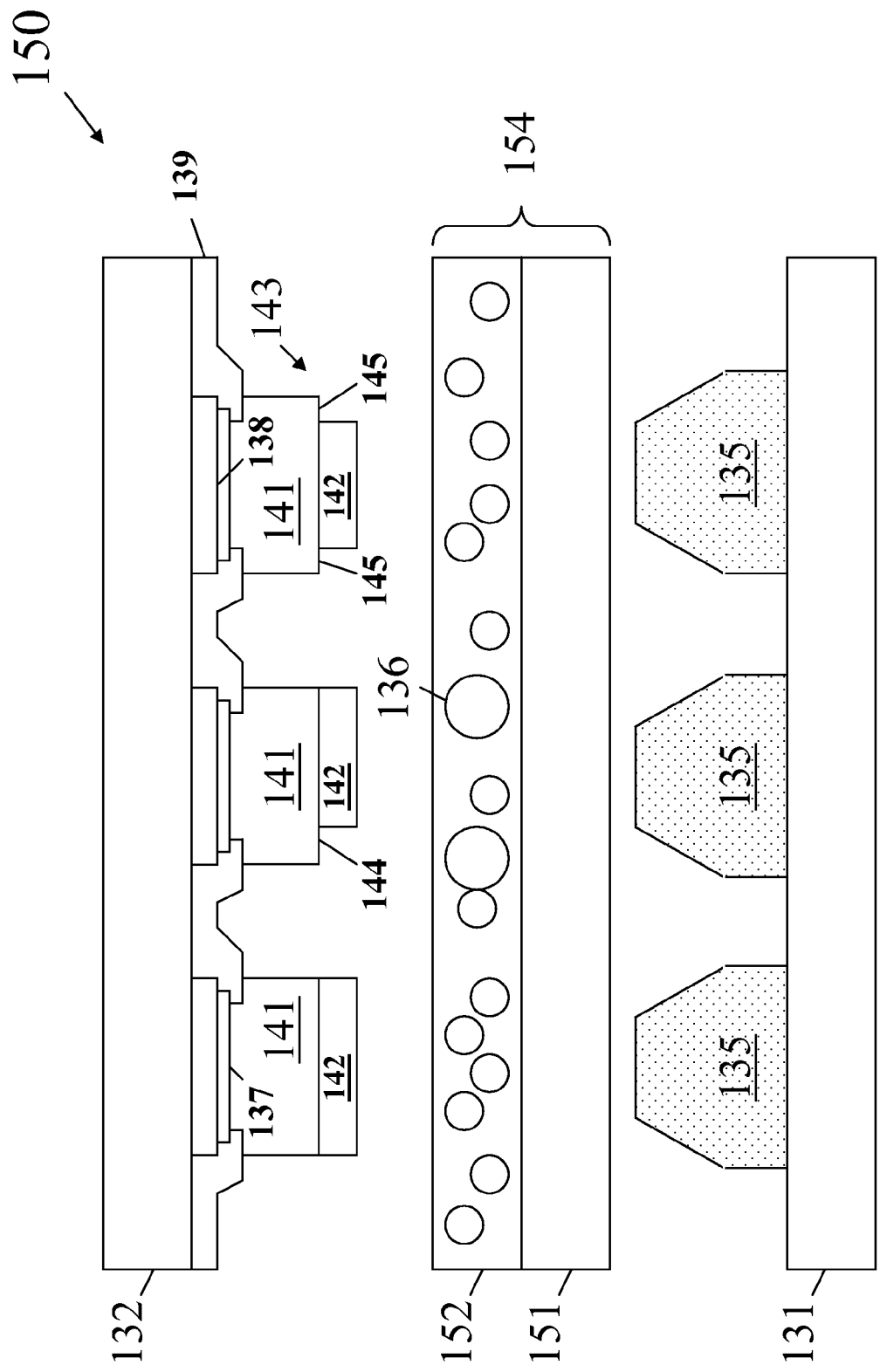
FIG. 14A is a schematic diagram of an exemplary electronic assembly before assembled.

FIG. 14A is a schematic diagram of an exemplary electronic assembly 150 before being assembled. Referring to FIG. 14A, the electronic assembly 150 may be similar to the electronic assembly 140 described and illustrated with reference to FIG. 13B except that, for example, an anisotropic conductive adhesive (ACA) film 154 may replace the ACF film 133. Moreover, one or more of the bumps 143 may include a first shoulder 144 to facilitate electrical isolation between conductive portions 142 of adjacent bumps 143. In another example, one or more of the bumps 143 may include a second shoulder 145, which may surround the conductive portion 142. In each of the bumps 143, the conductive portion 142 may extend from a top surface of the insulating body 141 via at least one sidewall of the insulating body 141 toward the second substrate 132 so that electrical connection between the first substrate 31 and the second substrate 32 may be achieved via the bonds 135 and the bumps 143 when electrically coupled. In one example, similar to the bumps 52, 52a and 52b respectively illustrated in FIGS. 2A and 2B, 3A and 3B, and 4A and 4B, or the bumps 82, 82a and 82b respectively illustrated in FIGS. 6A and 6B, 7A and 7B, and 8A and 8B, each of the bumps 143 may include at least one side wall free from the conductive portion 142. Furthermore, for any immediately adjacent bumps 143, one or more of the sidewalls facing each other may be free from the conductive portion 142.

FIGS. 14B, 14C and 14D are schematic diagrams each showing a cross-sectional view and a top view of a bump in accordance with examples of the present invention. Referring to FIG. 14B, a bump 143-1 similar to one of the bumps 143 shown in FIG. 14A may include the insulating body 141 and a conductive portion 142-1. The conductive portion 142-1 may cover a top surface 141-3 and sidewalls (not numbered) of the insulating body 141.

Referring to FIG. 14C, a bump 143-2 similar to one of the bumps 143 shown in FIG. 14A may include the insulating body 141 and a conductive portion 142-2. The conductive portion 142-2 may expose a portion of the top surface 141-3 and at least one sidewall 141-1 of the insulating body 141. The exposed portion of the top surface 141-3 of the insulating body 141 may subsequently form the first shoulder 144 as shown in FIG. 14A.

Referring to FIG. 14D, a bump 143-3 similar to one of the bumps 143 shown in FIG. 14A may include the insulating body 141 and a conductive portion 142-3. The conductive portion 142-3 may expose portions of the top surface 141-3 and at least one sidewall 141-1 and 141-2 of the insulating body 141. The exposed portions of the top surface 141-3 of the insulating body 141 may subsequently form the second shoulder 145 as shown in FIG. 14A.

Referring back to FIG. 14A, the ACA film 154 may include a multilayer structure formed by laminating conductive and non-conductive films. In the present example, the ACA film 154, in the form of a two-layer structure, may include a first layer 151 and a second layer 152. The first layer 151 may include a non-conductive material such as a non-conductive film (NCF) or a non-conductive paste (NCP). The second layer 152 may include a conductive material such as an anisotropic conductive film (ACF) or an anisotropic conductive paste (ACP). The conductive particles 36 in the second layer 152 may each have a size or diameter ranging from approximately 2 to 10 μm, which may be significant to the height of the bonds 135 ranging from approximately 2 to 15 μm and the bond pitch "D" of approximately 5 μm when the short-circuiting issue is concerned. In one example, the ACA film 154 may be applied over the first substrate 131 by, for example, a coating process or other suitable processes with the first layer 151 facing toward the first substrate 131. In another example, the ACA film 154 may be applied over the second substrate 132 with the second layer 152 facing toward the second substrate 132.

When assembled, the first, non-conductive layer 151 may largely be positioned at the first substrate 131 side, which may facilitate electrical isolation between adjacent bonds 135. Moreover, the second, conductive layer 152 may largely be positioned at the second substrate 131 side or between the bonds 135 and the bumps 143, which may facilitate electrical coupling between corresponding bonds 135 and bumps 143.

Figure 15A:
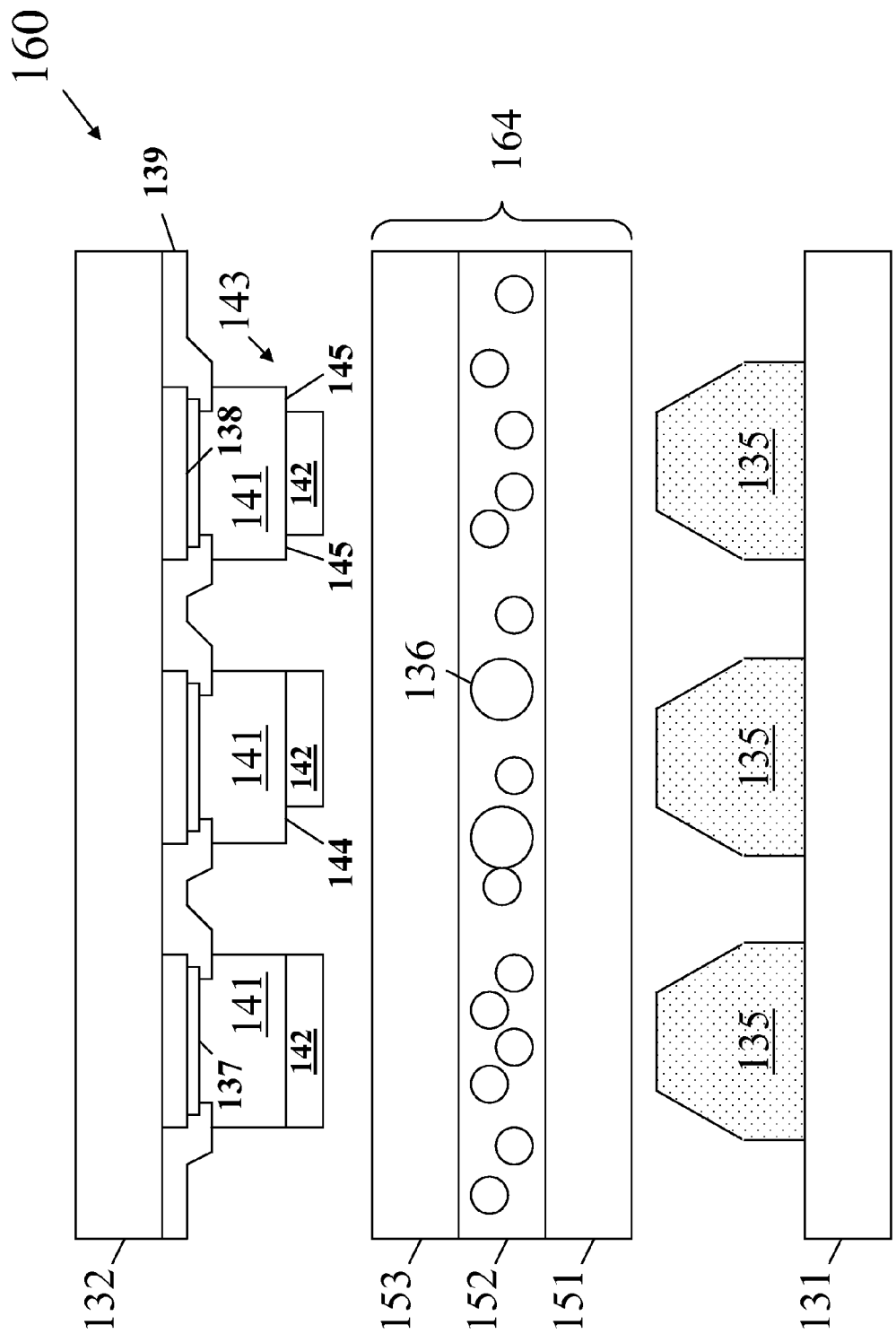
FIG. 15A is a schematic diagram of another exemplary electronic assembly before assembled.

FIG. 15A is a schematic diagram of another exemplary electronic assembly 160 before being assembled. Referring to FIG. 15A, the electronic assembly 160 may be similar to the electronic assembly 150 described and illustrated with reference to FIG. 14A except that, for example, an ACA film 164 may replace the ACF film 154. Specifically, the ACA film 164, in the form of a three-layer structure, may further include a third layer 153 in addition to the first layer 151 and the second layer 152. The third layer 153, like the first layer 151, may include a non-conductive material such as an NCF or NCP, and may sandwich the second layer 152 with the first layer 151. In one example, the ACA film 164 may be applied over the first substrate 131 by, for example, a coating process or other suitable processes with one of the first layer 151 and the third layer 153 facing toward the first substrate 131. In another example, the ACA film 164 may be applied over the second substrate 132 with one of the first layer 151 and the third layer 153 facing toward the second substrate 132.

When assembled, one of the non-conductive layers 151 and 153 may largely be positioned at the first substrate 131 side, which may facilitate electrical isolation between adjacent bonds 135. Furthermore, the other one of the non-conductive layers 151 and 153 may largely be positioned at the second substrate 132 side, which may facilitate electrical isolation between adjacent bumps 143. Moreover, the second, conductive layer 152 may largely be positioned between the bonds 135 and the bumps 143, which may facilitate electrical coupling between corresponding bonds 135 and bumps 143.

Figure 15B:
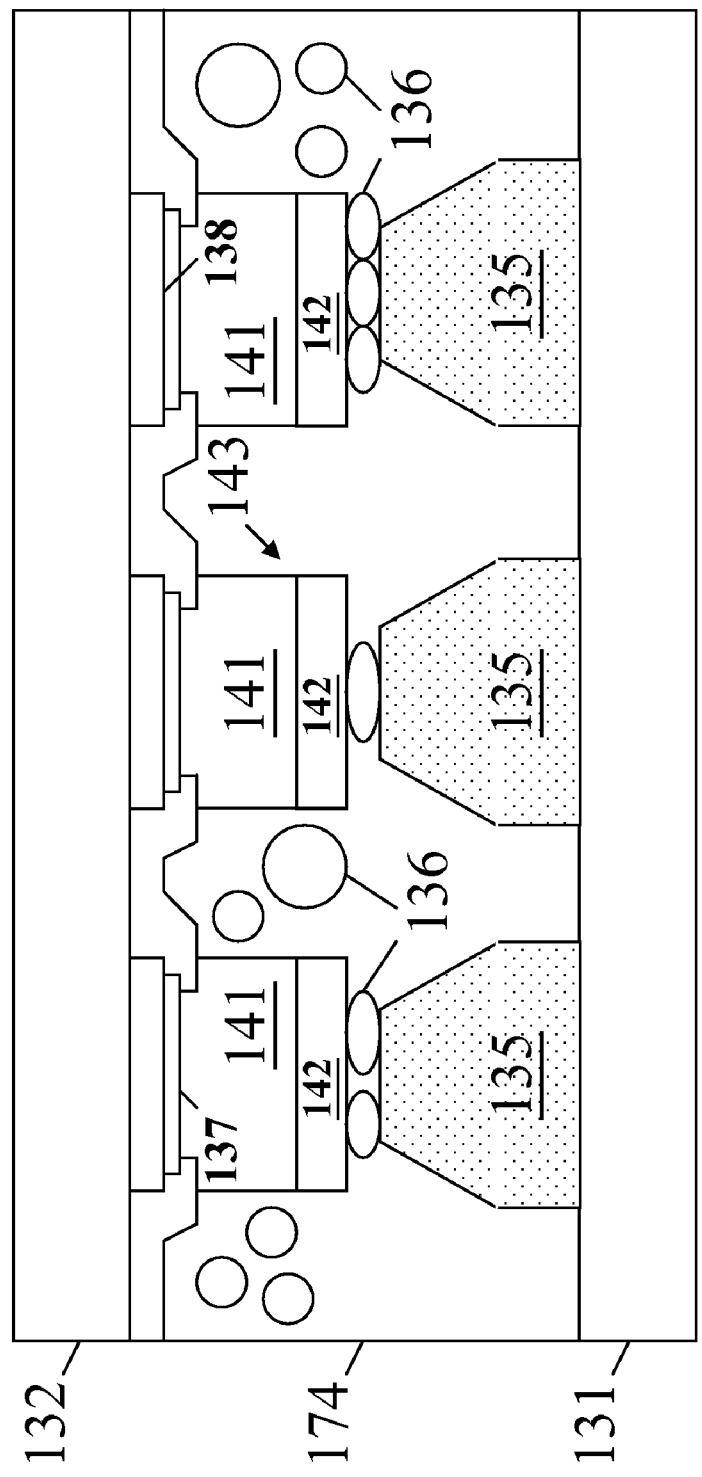
FIG. 15B is a schematic diagram of an exemplary electronic assembly after assembled.

FIG. 15B is a schematic diagram of an exemplary electronic assembly 170 after assembled. Referring to FIG. 15B, the electronic assembly 170 may include an ACA film 174. The ACA film 174 may include a multilayer structure similar to the two-layer ACA film 154 shown in FIG. 14A or the three-layer ACA film 164 shown in FIG. 15A. With the ACA film 174, the conductive particles 136 may largely be positioned at the second substrate 132 side or between the bonds 135 and bumps 143. That is, the conductive particles 136 may be positioned over the bonds 135 and therefore short-circuiting between adjacent bonds 135 due to the clustering or existence of the conducting particles 136 therebetween may be prevented.

It will be appreciated by those skilled in the art that changes could be made to the preferred embodiments described above without departing from the broad inventive concept thereof. It is understood, therefore, that this invention is not limited to the particular embodiments disclosed, but is intended to cover modifications within the spirit and scope of the present application as defined by the appended claims.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

We claim:

1. An electronic assembly comprising:
   a first substrate;
   a number of bonds on the first substrate;
   a second substrate spaced apart from the first substrate;
   a number of bumps on the second substrate, each of the bumps including an insulating body having a plurality of sidewalls, and including a conductive portion that covers at least a portion of a top surface of the insulating body, the conductive portion extending from the top surface of the insulating body via at least one sidewall of the insulating body toward the second substrate, wherein at least one of the sidewalls facing each other in immediately adjacent bumps of at least two of the number of bumps is not in contact with the conductive portion of either of the respective adjacent bumps; and
   an adhesive between the first substrate and the second substrate, the adhesive including an insulating layer and a conductive layer, the insulating layer and the conductive layer being laminated with respect to each other, wherein the insulating layer is positioned closer to the first substrate than the conductive layer.

2. The electronic assembly of claim 1, wherein at least one of the first substrate and the second substrate includes one of a flexible substrate, a printed circuit board (PCB), a silicon substrate and a glass substrate.

3. The electronic assembly of claim 1, wherein the insulating layer of the adhesive includes one of a non-conductive film and a non-conductive paste.

4. The electronic assembly of claim 1, wherein the conductive layer of the adhesive includes one of an anisotropic conductive film or an anisotropic conductive paste.

5. The electronic assembly of claim 4, wherein the conductive layer includes conductive particles, and wherein the conductive particles are positioned over the bonds on the first substrate.

6. The electronic assembly of claim 1, wherein the conductive portion of at least one of the number of bumps covers the at least one sidewall of the insulating body.

7. The electronic assembly of claim 1, wherein the conductive portion of at least one of the number of bumps covers at least a portion, but not all, of the top surface of the insulating body.

8. The electronic assembly of claim 1, wherein the conductive portion of at least one of the number of bumps exposes a potion of the top surface of the insulating body.

9. The electronic assembly of claim 1, wherein the conductive layer of the adhesive includes a number of particles, each of the particles having a diameter close to the height of each of the bonds.

10. The electronic assembly of claim 1, wherein each of the bonds has a height ranging from 2 to 15 micrometers.

11. An electronic assembly comprising:
    a first substrate;
    a number of bonds on the first substrate;
    a second substrate spaced apart from the first substrate;
    a number of bumps on the second substrate, each of the bumps including an insulating body having a plurality of sidewalls, and including a conductive portion that covers at least a portion of a top surface of the insulating body, the conductive portion extending from the top surface of the insulating body via at least one sidewall of the insulating body toward the second substrate, wherein at least one of the sidewalls facing each other in immediately adjacent bumps of at least two of the number of bumps is the conductive portion of either of the respective adjacent bumps; and
    an adhesive between the first substrate and the second substrate, the adhesive including a first insulating layer, a second insulating layer and a conductive layer between the first insulating layer and the second insulating layer, wherein one of the first insulating layer and the second insulating layer is positioned near the first substrate and the other one of the first insulating layer and the second insulating layer is positioned near the second substrate.

12. The electronic assembly of claim 11, wherein at least one of the first substrate and the second substrate includes one of a flexible substrate, a printed circuit board (PCB), a silicon substrate and a glass substrate.

13. The electronic assembly of claim 11, wherein the conductive layer of the adhesive includes one of an anisotropic conductive film or an anisotropic conductive paste.

14. The electronic assembly of claim 11, wherein the conductive layer of the adhesive includes conductive particles, and wherein the conductive particles are positioned over the bonds on the first substrate.

15. The electronic assembly of claim 11, wherein the conductive portion of at least one of the number of bumps covers the at least one sidewall of the insulating body.

16. The electronic assembly of claim 11, wherein the conductive portion of at least one of the number of bumps covers at least a portion, but not all, of the top surface of the insulating body.

17. The electronic assembly of claim 11 wherein the conductive portion of at least one of the number of bumps exposes a potion of the top surface of the insulating body.

18. The electronic assembly of claim 11, wherein each of the bonds has a height ranging from 2 to 15 micrometers.

19. An electronic assembly comprising:
    a first substrate;
    a number of bonds on the first substrate;
    a second substrate spaced apart from the first substrate;
    a number of bumps on the second substrate, each of the bumps including an insulating body having a plurality of sidewalls, and including a conductive portion that covers at least a portion of a top surface of the insulating body, the conductive portion extending from the top surface of the insulating body via at least one sidewall of the insulating body toward the second substrate, wherein at least one of the sidewalls facing each other in immediately adjacent bumps of at least two of the number of bumps is the conductive portion of either of the respective adjacent bumps; and a multilayer adhesive between the first substrate and the second substrate, the multilayer adhesive including at least one insulating layer and a conductive layer, wherein the conductive layer includes conductive particles positioned over the bonds on the first substrate.

20. The electronic assembly of claim 19, wherein the at least one insulating layer of the multilayer adhesive includes a first insulating layer, the first insulating layer and the conductive layer being laminated with respect to each other.

21. The electronic assembly of claim 19, wherein the at least one insulating layer of the multilayer adhesive includes a first insulating layer and a second insulating layer, the conductive layer being sandwiched between the first insulating layer and the second insulating layer.

22. The electronic assembly of claim 19, wherein each of the bonds has a height ranging from 2 to 15 micrometers.

23. The electronic assembly of claim 19, wherein the conductive portion of at least one of the number of bumps covers at least a portion, but not all, of the top surface of the insulating body.

24. The electronic assembly of claim 19, wherein the conductive portion of at least one of the number of bumps exposes a potion of the top surface of the insulating body.

* * * * *